US006160427A

United States Patent [19]

Cipriani et al.

[11] Patent Number: 6,160,427

[45] Date of Patent: Dec. 12, 2000

[54] COMPACT CUBIC FUNCTION GENERATOR

[75] Inventors: Stefano Cipriani, Florence, Italy; Anthony A. Takeshian, Laguna Niguel, Calif.

[73] Assignee: Conexant Systems, Inc., Newport Beach, Calif.

[21] Appl. No.: 09/148,568

[22] Filed: Sep. 4, 1998

[51] Int. Cl.[7] .................................................. H03K 4/04

[52] U.S. Cl. ......................... 327/125; 327/346; 327/356

[58] Field of Search .................................. 327/335, 346, 327/347, 125, 131, 132, 349, 530, 538, 356; 323/311, 312, 315

[56] References Cited

U.S. PATENT DOCUMENTS

| | | | |
|---|---|---|---|
| 5,557,194 | 9/1996 | Kato | 323/315 |
| 5,619,122 | 4/1997 | Kearney et al. | 323/312 |
| 5,642,066 | 6/1997 | Burke | 327/132 |

OTHER PUBLICATIONS

Yamakawa, et al., "An n–th Power Function Generator and an n–th Rooter in Current Mode", *Transactions of the Institute of Electronics and Communication Engineers of Japan*, Section E, JP, Inst. of Electronics & Communic. Engineers of Japan, Tokyo, vol. E65, No. 10, pp. 586–587, Oct. 10, 1982.

Platzer, Jr., "Using Transistor Circuits to Multiply and Divide", *Electronics*, vol. 39, No. 7, p. 109–115, Apr. 4, 1966.

*Primary Examiner*—Timothy P. Callahan
*Assistant Examiner*—Minh Nguyen
*Attorney, Agent, or Firm*—Knobbe, Martens, Olson & Bear LLP

[57] ABSTRACT

A transfer function generator which generates an output that is a cubic function of the input for use in low voltage, high frequency applications. The cubic function generator creates a signal path through high speed npn devices, thereby allowing the use of high frequencies. Further, the topography of the cubic function generator requires a voltage drop across only two semiconductor devices, thereby allowing use of the circuit in low voltage applications.

8 Claims, 6 Drawing Sheets

COMPACT CUBIC FUNCTION GENERATOR

BACKGROUND

1. Field of the Invention

The present invention relates to the field of transfer function generators. More specifically, the present invention relates to a low voltage, high frequency cubic function generator.

2. Description of the Related Art

Function generators are circuits having an output-input characteristic which can be set to approximate a given curve. Circuits that generate an output having a cubic relationship to the input are known as cubic function generators.

Function generators are used for a variety of purposes. For example, in wireless communication systems, a function generator may be used to tune a power amplifier to obtain the desired output from the power amplifier. The function generator provides a tuning signal to the power amplifier to offset the natural behavior of the amplifier.

In many systems today, especially in the digital environment, function generators are required to perform at high speeds. For example, many circuits operate at frequencies in the gigahertz range. In addition to the speed requirements, many digital systems are low voltage, requiring a function generator capable of operating at approximately 2 volts. If the function generator only needs to produce a quadratic function, the voltage criteria is easily met. However, existing circuits do not meet these specifications when a cubic function is required.

What is needed is a compact, cubic function generator capable of operating at high frequencies and low voltages. Specifically, a circuit is required that generates a cubic function while operating at approximately 2 volts and at frequencies up to and including the gigahertz range.

SUMMARY OF THE INVENTION

The present invention generates a cubic transfer function for low voltage, high frequency applications. The cubic function generator of the present invention may be used, for example, in a control loop to linearize the output of a power amplifier in high speed wireless communication circuits.

The present invention generates a cubic transfer function while maintaining a voltage drop across only two active devices. This allows the present invention to operate with low voltage applications, specifically applications requiring a voltage drop of approximately 2 volts. Also, the circuit of the present invention may be formed on a semiconductor wafer, thereby enabling the circuit to operate at high frequencies.

One embodiment of the present invention comprises a cubic function generator comprising a first current source having a first terminal and a second terminal and a first transistor having a base, an emitter, and a collector, wherein the second terminal of the first current source is coupled to the base of the first transistor and the second terminal of the first current source is coupled to the collector of the first transistor. A first diode and a second diode are included, wherein the anode of the first diode is coupled to the second terminal of the first current source, the cathode of the first diode is coupled to the anode of the second diode, and the cathode of the second diode is coupled to ground. A second transistor has a base, an emitter, and a collector, wherein the emitter of the first transistor is coupled to the base of the second transistor, the emitter of the second transistor being coupled to ground. A third transistor has a base, an emitter, and a collector, wherein the emitter of the first transistor is coupled to the collector of the third transistor, the emitter of the third transistor being coupled to ground. A third diode and a fourth diode are included, wherein the cathode of the third diode and the anode of the fourth diode are coupled to the base of the third transistor while the cathode of the fourth diode is coupled to ground. A second current source has a first terminal and a second terminal, the second terminal of the second current source being coupled to the anode of the third diode and the first terminal of the second current source being coupled to the collector of the first transistor. A fourth transistor has a base, an emitter, and a collector, wherein the base of the first transistor is coupled to the anode of the third diode and the second terminal of the second current source is coupled to the collector of the fourth transistor. A fifth transistor has a base, an emitter, and a collector, wherein the emitter of the fourth transistor and the collector of the second transistor are coupled to the base of the fifth transistor, while the emitter of the fifth transistor is coupled to ground.

One embodiment of the invention comprises a first current source ($I_3$) and a second current source ($I_c$). The second current source is dependent from the first current source so as to create an output ($I_{out}$) that is a cubic function of the second current source in relation to the first current source so that:

$$I_{out} = \frac{I_3^3}{I_c^2}$$

wherein the maximum voltage of the cubic function generator is $2^*(V_{be}+V_{ce(sat)})$.

BRIEF DESCRIPTION OF THE DRAWINGS

These and other features and advantages of the invention will become more apparent upon reading the following detailed description and upon reference to the accompanying drawings.

DETAILED DESCRIPTION OF THE PREFERRED EMBODIMENT

Figure 1:
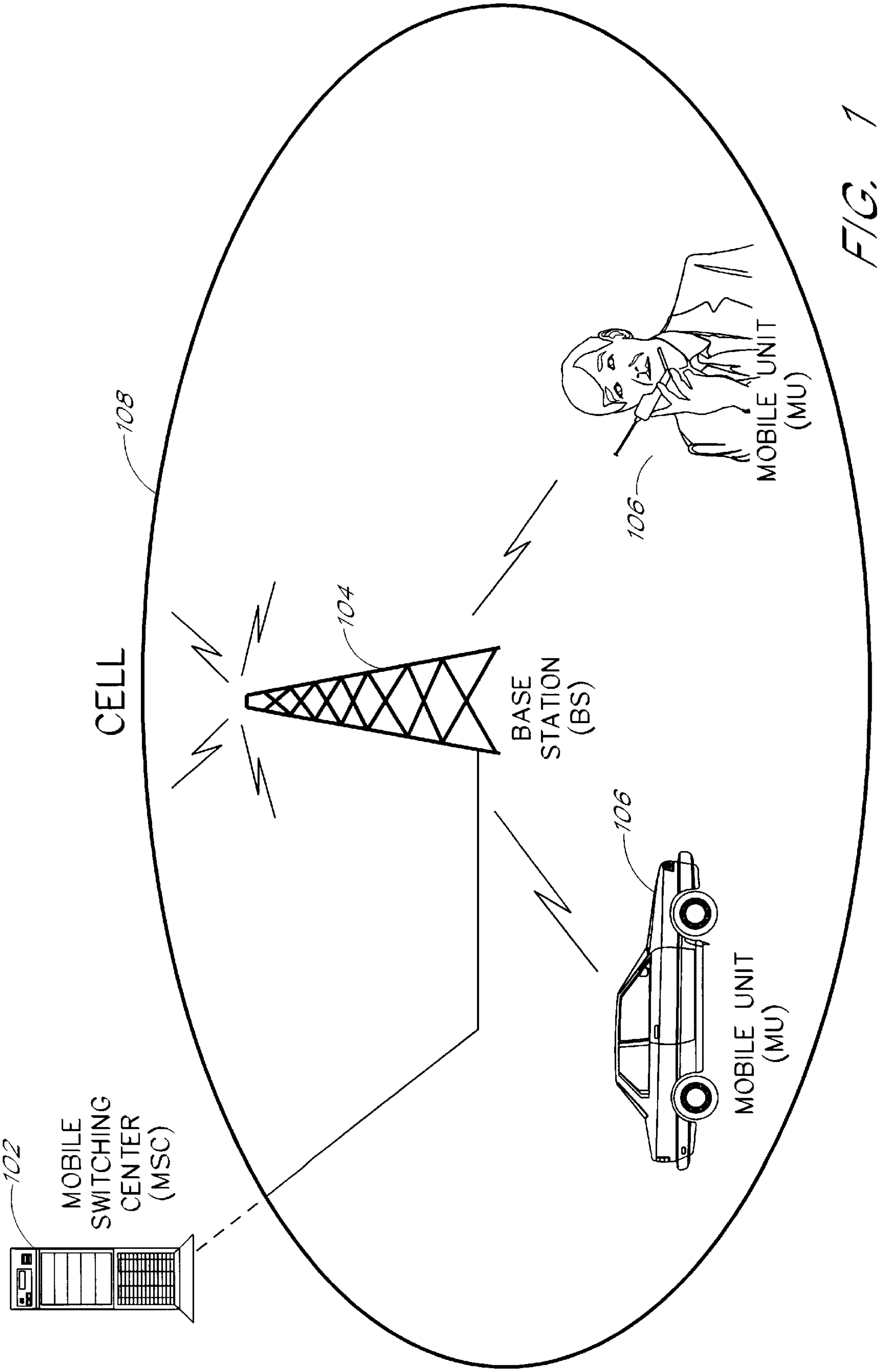
FIG. 1 illustrates components of a wireless communication system appropriate for use with an embodiment of the invention.

FIG. 1 illustrates components of a wireless communication system. A mobile switching center 102 communicates with a base station 104. The base station 104 broadcasts data to and receives data from mobile units 106 within a cell 108. The cell 108 is a geographic region, roughly hexagonal, having a radius of up to 35 kilometers or possibly more.

The mobile unit 106 is capable of receiving data from and transmitting data to a base station 104 in compliance with the Global System for Mobile communications (GSM). GSM is a communication standard permitting mobile users of wireless communication devices to exchange data over a telephone system wherein radio signals carry data to and from the wireless devices. Under the GSM standard, additional cells adjacent to the cell 108 permit mobile units 106 to cross cell boundaries without interrupting communications. This is because base stations 104 in adjacent cells assume the task of transmitting and receiving data for the mobile units 106. The mobile switching center 102 coordinates all communication to and from mobile units 106 in a multi-cell region, thus the mobile switching center 102 may communicate with many base stations 104.

The mobile units 106 may move about freely within the cell 108 while communicating either voice or data. The mobile units 106 not in active communication with other telephone system users may, nevertheless, scan base station 104 transmissions in the cell 108 to detect any telephone calls or paging messages directed to the mobile unit 106.

One example of such a mobile unit 106 is a cellular telephone used by a pedestrian who, expecting a telephone call, powers on the cellular telephone while walking in the cell 108. The cellular telephone synchronizes communication with the base station 104. The cellular telephone then registers with the mobile switching center 102 to make itself known as an active user within the GSM network.

As discussed in further detail below, the mobile unit 106 scans data frames broadcast by the base station 104 to detect any telephone calls or paging messages directed to the cellular telephone. In this call detection mode, the mobile unit 106 receives, stores and examines paging message data, and determines whether the data contains an identifier matching an identifier of the mobile unit 106. If a match is detected, the mobile unit 106 establishes a call with the mobile switching center 102 via the base station 104. If no match is detected, the mobile unit 106 enters an idle state for a predetermined period of time, then exits the idle state to receive another transmission of paging message data.

A common implementation of the GSM system uses frequencies in the 900 megahertz (MHz) range. In particular, mobile units 106 transmit in the 890–915 MHz range and base stations 104 transmit in the higher 935–960 MHz range. Each 25 MHz range is divided into 125 radio frequency channels, each having a width of 200 kilohertz (kHz). The direction of communication from a mobile unit 106 to a base station 104 is referred to as uplink, and the direction from a base station 104 to a mobile unit 106 is referred to as downlink.

Figure 2:
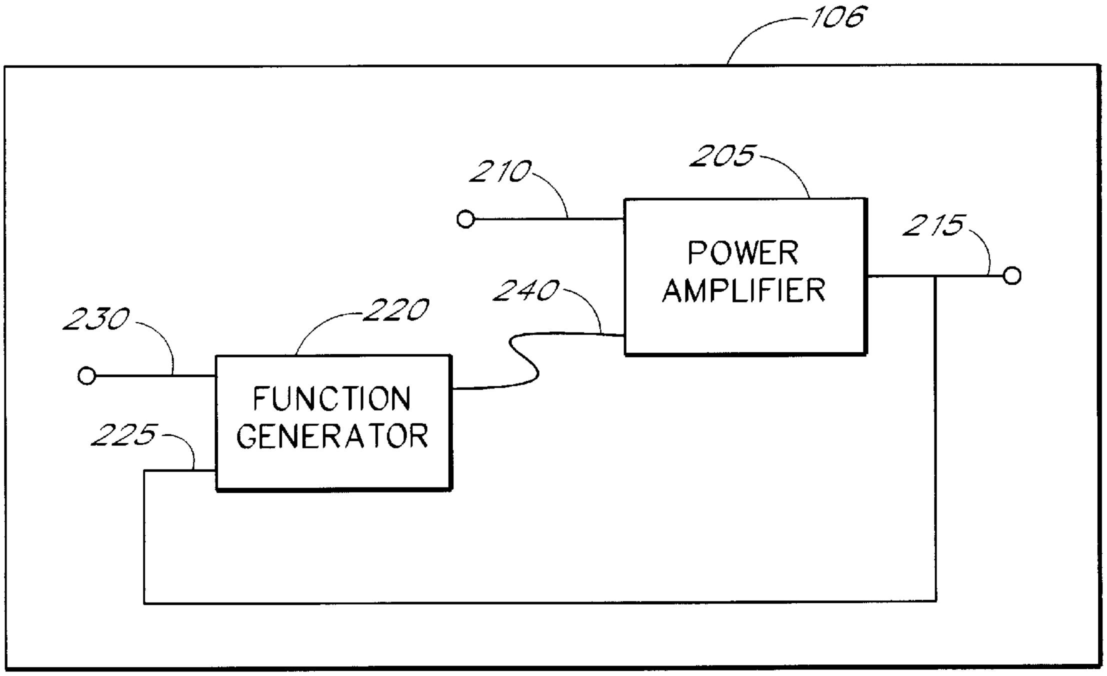
FIG. 2 is a block diagram showing a portion of the mobile unit of FIG. 1.

FIG. 2 illustrates a portion of the mobile unit 106. The mobile unit 106 contains a power amplifier 205 to increase the power of an input signal 210. The input signal 210 is amplified, and the result is an output signal 215. The output signal 215 is related to the input signal 210 based upon the inherent function of the power amplifier 205. For example, if the power amplifier is inherently non-linear, the output signal 215 will be an amplified, non-linear version of the input signal 210.

If a linear output signal 215 is desired, the inherent function of the power amplifier 205 may be compensated for by the use of a control input 240. A signal which compensates for the function of the power amplifier 205 is supplied at the control input 240. The compensating signal is supplied by a function generator 220. The function generator 220 may be selected as required by the inherent function of the power amplifier 205. For example, if the power amplifier 205 produces an output signal related to the input signal by $1/x^2$, the function generator 220 should be designed to produce a quadratic function. If the power amplifier 205 produces an output signal related to the input signal by $1/x^3$, the function generator 220 should be designed to produce a cubic function. A reference voltage 230 is supplied as an input to the function generator 230. A second input 225 to the function generator is a feedback loop of the output signal 215. Providing the output signal 215 in a feedback loop to be an input to the function generator 220 enhances the overall linearity of the entire circuit.

Figure 3:
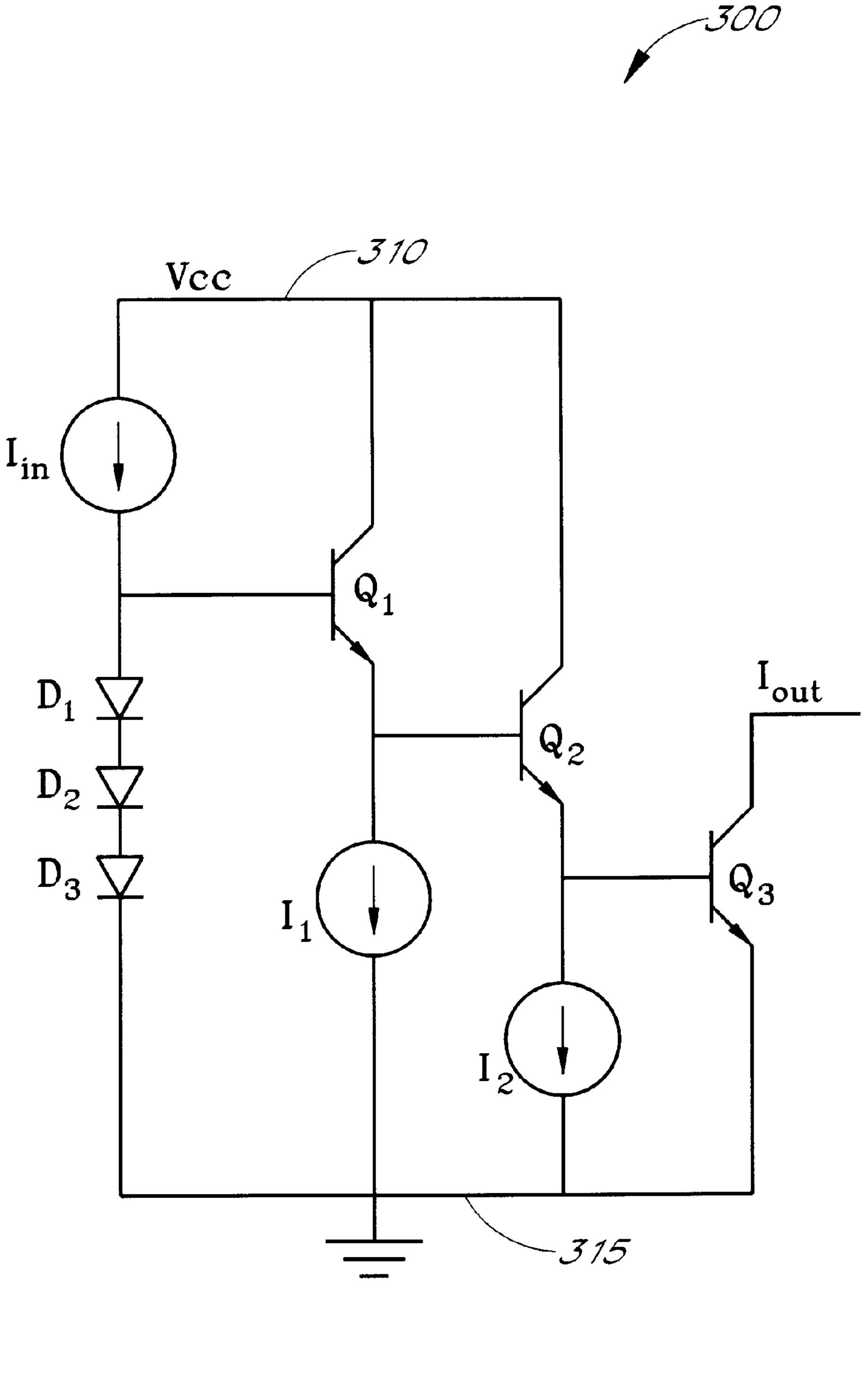
FIG. 3 (PRIOR ART)
FIG. 3 is a schematic circuit diagram of a prior art cubic function generator.

Many power amplifiers produce an output signal related to the input signal by $1/x^3$. A prior art circuit 300 used to provide a cubic function to compensate for these power amplifiers is shown in FIG. 3. The circuit 300 comprises diodes D1–D3, transistors Q1–Q3, and current sources $I_{in}$, $I_1$ and $I_2$.

A first terminal of the current source $I_{in}$ is connected to the positive voltage rail 310. The positive voltage rail 310 is at a voltage $V_{cc}$. A second terminal of the current source $I_{in}$ is connected to the anode of the diode D1 and to the base of the transistor Q1. The cathode of the diode D1 is connected to the anode of the diode D2. The cathode of the diode D2 is connected to the anode of the diode D3. The cathode of the diode D3 is connected to circuit ground 315.

The collector of the transistor Q1 is connected to the positive voltage rail 310. The emitter of the transistor Q1 is connected to the base of the transistor Q2 and to a first terminal of the current source $I_1$. The second terminal of the current source $I_1$ is connected to circuit ground 315.

The collector of the transistor Q2 is connected to the positive voltage rail 310. The emitter of the transistor Q2 is connected to the base of the transistor Q3 and to a first terminal of the current source 12. The second terminal of the current source 12 is connected to circuit ground 315. The emitter of the transistor Q3 is connected to circuit ground 315 and the collector of the transistor Q3 supplies the output current $I_{out}$.

In operation, the circuit 300 generates the cubic part of the transfer function so that:

$$I_{out} = \frac{I_{IN}^3}{I_1 I_2} \quad 2$$

However, the circuit 300 only functions at voltages at or above approximately 3 volts. This is because the topography of the circuit requires a voltage of $3^*(V_{be}+V_{ce(sat)})$, and the value of $V_{be}$ may be as high as 0.8–0.9 volts, while the value of $V_{ce(sat)}$ is 0.3 volts. The 3 volt limit makes the circuit unusable for many applications. For example, many low-voltage power amplifiers have a maximum voltage requirement of 2.7 volts.

Figure 5:
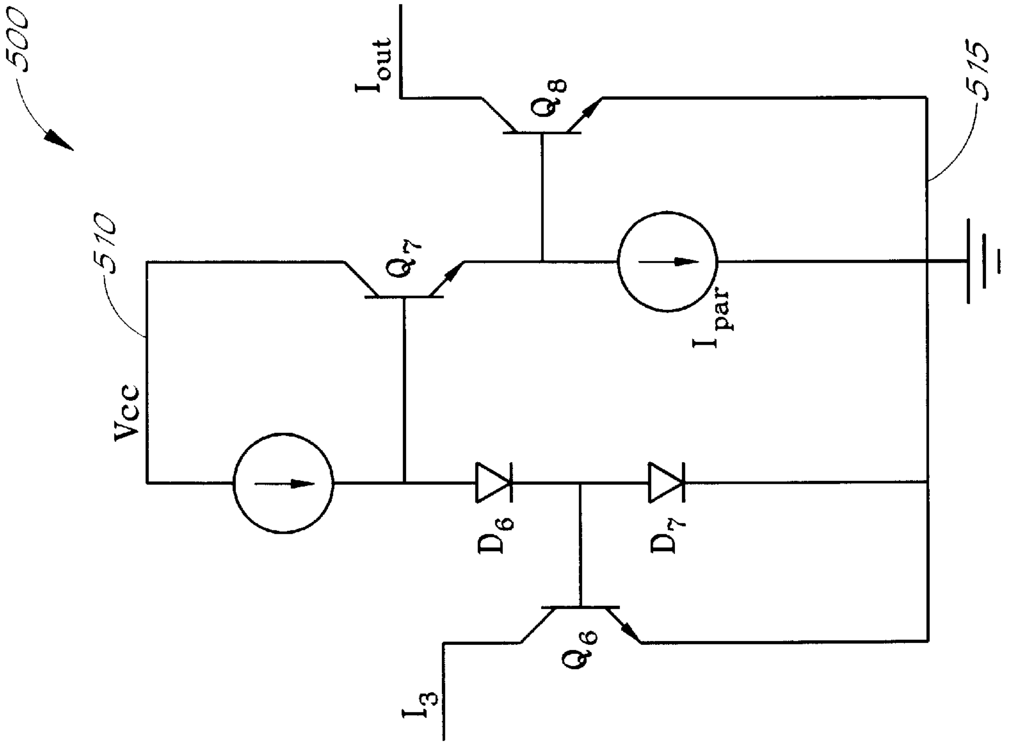
FIG. 5 is a schematic circuit diagram of a second portion of the cubic function generator according to the present invention.
Figure 4:
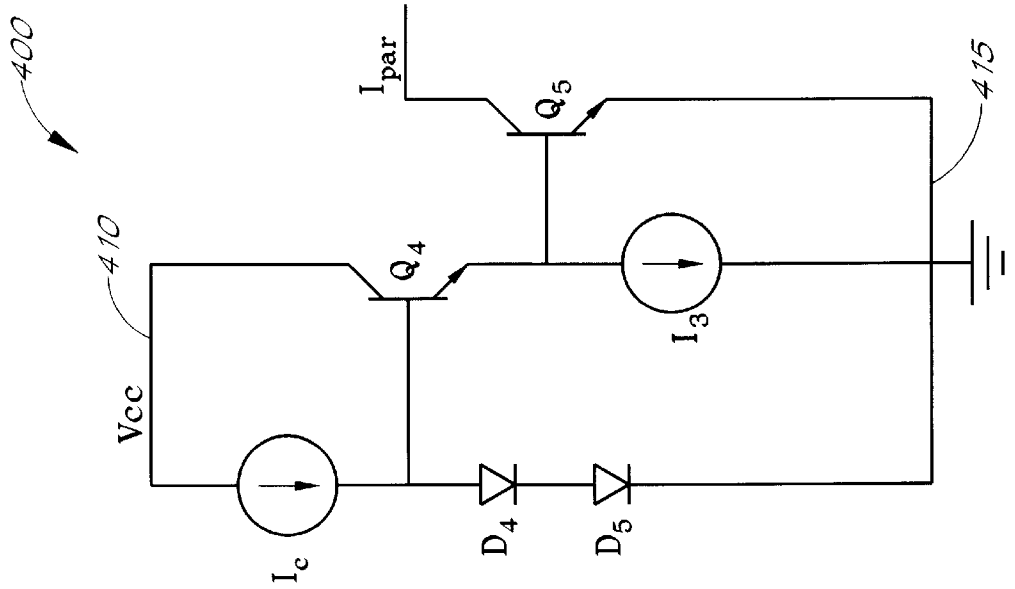
FIG. 4 is a schematic circuit diagram of a first portion of the cubic function generator according to the present invention.
Figure 6:
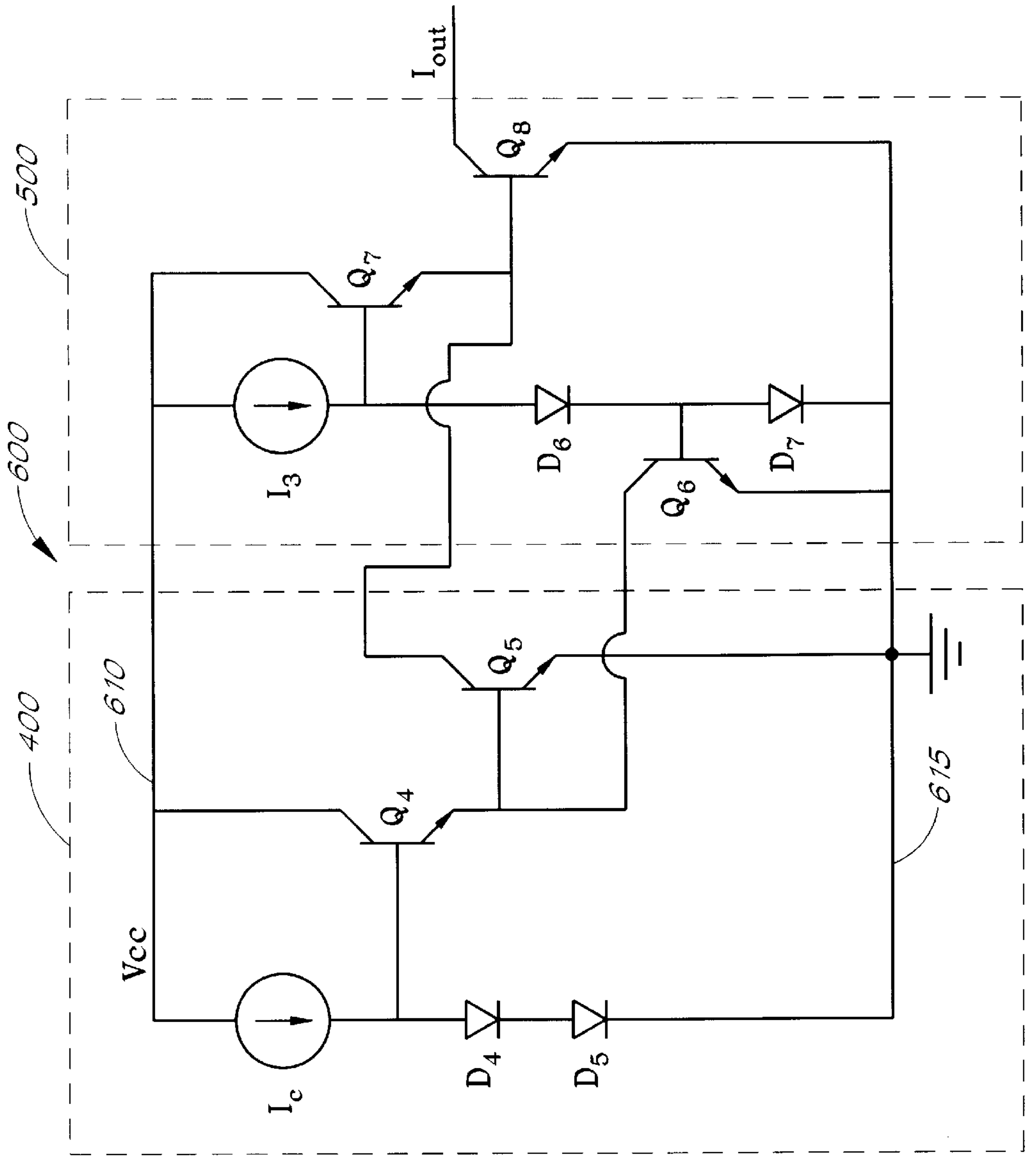
FIG. 6 is a schematic circuit diagram of the cubic function generator of the present invention.

A cubic function generator 600 according to the present invention is shown in FIGS. 4–6. The cubic function generator 600 is designed to work in high-frequency, low voltage applications. In FIG. 4, the first portion 400 of the cubic function generator 600 is shown. The first portion 400 comprises diodes D4 and D5, transistors Q4 and Q5, and current sources $I_c$ and $I_3$.

A first terminal of current source $I_c$ is connected to the positive voltage rail 410. The positive voltage rail 410 is at a voltage $V_{cc}$. A second terminal of the current source $I_c$ is connected to the anode of the diode D4 and to the base of the transistor Q4. The cathode of the diode D4 is connected to the anode of the diode D5. The cathode of the diode D5 is connected to circuit ground 415.

The collector of the transistor Q4 is connected to the positive voltage rail 410. The emitter of the transistor Q4 is connected to the base of the transistor Q5 and to a first terminal of the current source $I_3$. The second terminal of the current source $I_3$ is connected to circuit ground 415. The collector of the transistor Q5 outputs a current value $I_{par}$. The emitter of the transistor Q5 is connected to the circuit ground 415.

Based upon Kirchhoff's voltage law, the voltages across the diodes D4 and D5 must be equal to the voltages across the transistors Q4 and Q5. This may be expressed as follows:

$$V_{be4}+V_{be5}=V_{d4}+V_{d5} \quad 3$$

The current through a semiconductor device is defined according to Schottky's equation as follows:

$$I_c=I_s e^{vsd/Vt} \quad 4$$

In Schottky's equation, $I_c$ is the current through the collector of the transistor, $I_s$ is the saturation current of the transistor, $V_{sd}$ is the voltage across the semiconductor device, and $V_t$ is the thermal voltage. By solving Schottky's equation for $V_{sd}$ and making the appropriate substitutions, the equation for the voltages across the diodes and the transistors is as follows:

$$V_t \ln\left(\frac{I_3}{I_s}\right) + V_t \ln\left(\frac{I_{par}}{I_s}\right) = 2V_t \ln\left(\frac{I_c}{I_s}\right) \quad 5$$

The thermal voltage $V_t$ is a constant of 25.9 millivolts. Assuming that the diodes D4–D5 and the transistor Q4–Q5 are the same size, then equation (4) may be simplified as follows:

$$\frac{I_3 I_{par}}{I_s^2} = \left(\frac{I_c}{I_s}\right)^2 \quad 6$$

This equation may be further simplified to be:

$$I_{par} = \frac{I_c^2}{I_3} \quad 7$$

Therefore, the first portion 400 of the cubic function generator 600 produces an output current $I_{par}$ that is a quadratic function of the input current $I_c$.

The second portion 500 of the cubic function generator 600 is shown in FIG. 5. The second portion 500 comprises diodes D6 and D7, transistors Q6–Q8, and current sources $I_{par}$ and $I_3$.

A first terminal of current source $I_3$ is connected to the positive voltage rail 510. The positive voltage rail 510 is at a voltage $V_{cc}$. A second terminal of the current source $I_3$ is connected to the anode of the diode D6 and to the base of the transistor Q7. The cathode of the diode D6 is connected to the anode of the diode D7 and to the base of the transistor Q6. The collector of the transistor Q6 receive a current $I_3$ and the emitter of the transistor Q6 is connected to the circuit ground 515. The cathode of the diode D7 is also connected to the circuit ground 515.

The collector of the transistor Q7 is connected to the positive voltage rail 510. The emitter of the transistor Q7 is connected to the base of the transistor Q8 and to a first terminal of the current source $I_{par}$. The second terminal of the current source $I_{par}$ is connected to the circuit ground 515. The collector of the transistor Q8 outputs a current value $I_{out}$. The emitter of the transistor Q8 is connected to the circuit ground 515.

Again, Kirchhoff's voltage law may be used to express the voltages across the diodes D6 and D7 as equal to the voltages across the transistors Q7 and Q8. This expression is as follows:

$$V_{be7}+V_{be8}=V_{d6}+V_{d7} \quad 8$$

Solving Schottky's equation for $V_{sd}$ and making the appropriate substitutions, the equation for the voltages across the diodes and the transistors is as follows:

$$V_t \ln\left(\frac{I_{par}}{I_s}\right) + V_t \ln\left(\frac{I_{out}}{I_s}\right) = 2V_t \ln\left(\frac{I_3}{I_s}\right) \quad 9$$

which may be simplified to:

$$I_{out} = \frac{I_3^2}{I_{par}} \quad 10$$

Therefore, the output current $I_{out}$ of the second portion 500 of the cubic function generator 600 is a quadratic function of the input current $I_3$.

The first section 400 and the second section 500 of the cubic function generator 600 may be combined and simplified to produce the circuit of FIG. 6. The cubic function generator 600 comprises diodes D4–D7, transistors Q4–Q8, and current sources $I_c$ and $I_3$.

A first terminal of current source $I_c$ is connected to the positive voltage rail 610. The positive voltage rail 610 is at a voltage $V_{cc}$. A second terminal of the current source $I_c$ is connected to the anode of the diode D4 and to the base of the transistor Q4. The cathode of the diode D4 is connected to the anode of the diode D5. The cathode of the diode D5 is connected to circuit ground 615.

The collector of the transistor Q4 is connected to the positive voltage rail 610. The emitter of the transistor Q4 is connected to the base of the transistor Q5 and to the collector of the transistor Q6. The collector of the transistor Q5 is connected to the emitter of the transistor Q7 and the base of the transistor Q8. The emitter of the transistor Q5 is connected to the circuit ground 615.

The emitter of the transistor Q6 is connected to the circuit ground 615. The base of the transistor Q6 is connected to the cathode of the diode D6 and the anode of the diode D7. The cathode of the diode D7 is connected to the circuit ground 615. The anode of the diode D6 is connected to a second terminal of the current source $I_3$ and to the base of the transistor Q7. A first terminal of current source $I_3$ is connected to the positive voltage rail 610.

The collector of the transistor Q7 is connected to the positive voltage rail 610. As stated above, the emitter of the transistor Q7 is connected to the collector of the transistor Q5 and to the base of the transistor Q8. The emitter of the transistor Q8 is connected to the circuit ground 615. The collector of the transistor Q8 outputs a current value $I_{out}$.

Combining the solution to the output $I_{out}$ of the second portion 500 of the cubic function generator 600 with the solution to the output $I_{par}$ of the first portion 400 of the cubic function generator 600 results in the following:

$$I_{out} = \frac{I_3^3}{I_c^2} \quad (11)$$

This is the cubic function desired. However, the topography of the cubic function generator 600 allows generates the desired output current $I_{out}$ with a maximum voltage of $2*(V_{be}+V_{ce(sat)})$. This allows the use of the cubic function generator 600 in low voltage (approximately 2 volts) applications. Further, the signal path of the cubic function generator 600 is through high speed npn devices, thereby making use of the cubic function generator 600 in high frequency applications feasible.

The value of the input current $I_3$ may also be controlled to trim the transfer function. By varying the input current $I_3$, a controllable output $I_{out}$ is generated as follows:

$$I_{out} = \frac{(K * I_3)^3}{I_c^2} \quad (12)$$

Figure 7:
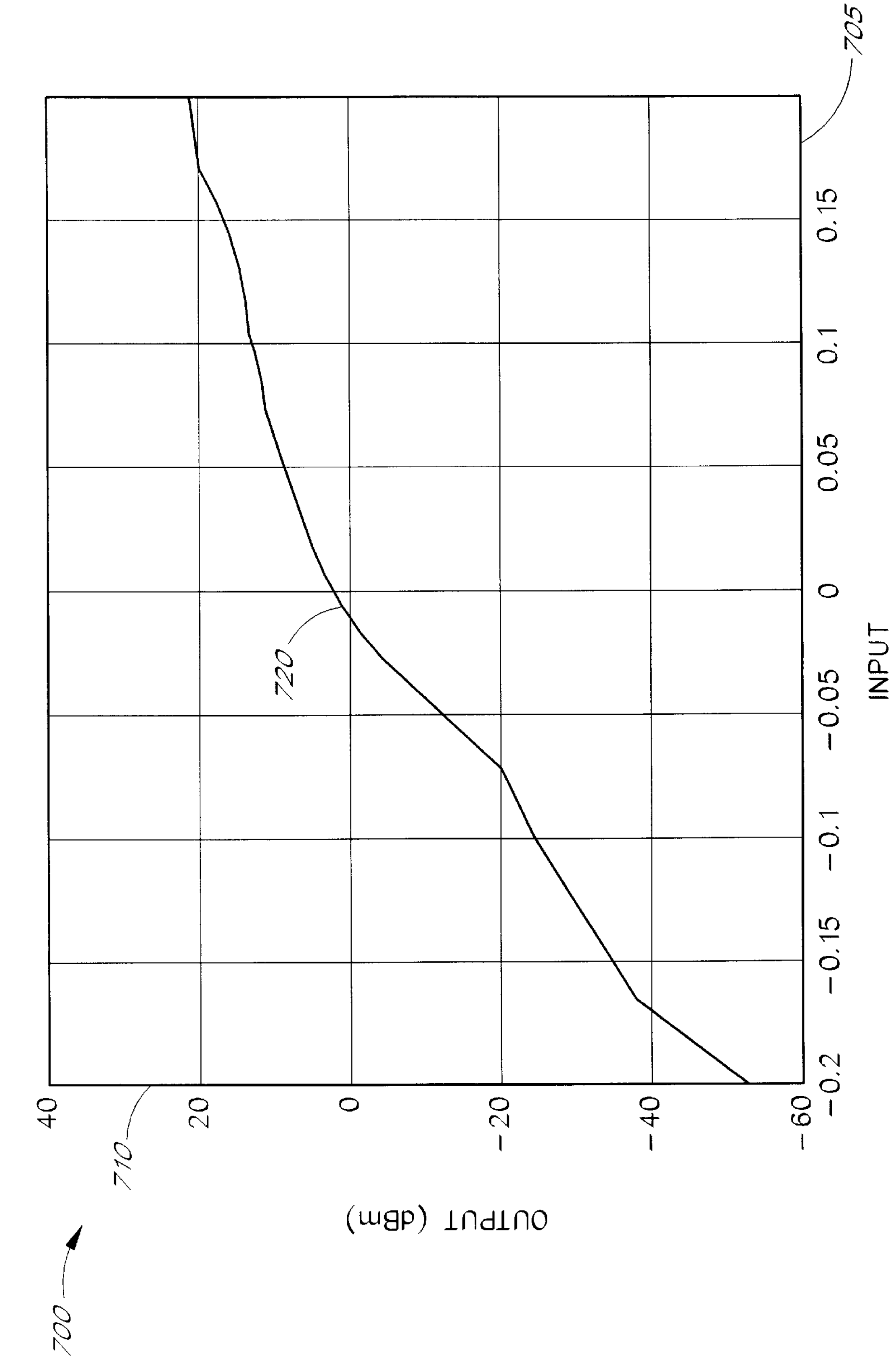
FIG. 7 illustrates the experimental results showing the output of a power amplifier being tuned by the cubic function generator according to FIG. 6.

FIG. 7 illustrates a graph 700 showing experimental results using the cubic function generator 600 as a shaper input to a power amplifier as in FIG. 2. For the experiment, the power amplifier produced an output signal related to the input signal substantially by $1/x^3$. The test was conducted using the setup of FIG. 2, with the function generator 220 being replaced by the specific cubic function generator 600. The graph 700 charts the input 210 on the horizontal axis 705 and the output 215 on the vertical axis 710. The cubic function generator 600 causes the output 215 of the power amplifier 205 to be approximately linear, as evidenced by output curve 720.

Numerous variations and modifications of the invention are possible. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A cubic function generator comprising:

a first current source having a first terminal and a second terminal;

a first transistor having a base, an emitter, and a collector, wherein the second terminal of the first current source is coupled to the base of the first transistor and the first terminal of the first current source is coupled to the collector of the first transistor;

a first diode and a second diode, wherein the anode of the first diode is coupled to the second terminal of the first current source, the cathode of the first diode is coupled to the anode of the second diode, and the cathode of the second diode is coupled to ground;

a second transistor having a base, an emitter, and a collector, wherein the emitter of the first transistor is coupled to the base of the second transistor, the emitter of the second transistor being coupled to ground;

a third transistor having a base, an emitter, and a collector, wherein the emitter of the first transistor is coupled to the collector of the third transistor, the emitter of the third transistor being coupled to ground;

a third diode and a fourth diode, wherein the cathode of the third diode and the anode of the fourth diode are coupled to the base of the third transistor, the cathode of the fourth diode being coupled to ground;

a second current source having a first terminal and a second terminal, the second terminal of the second current source being coupled to the anode of the third diode and the first terminal of the second current source being coupled to the collector of the first transistor;

a fourth transistor having a base, an emitter, and a collector, wherein the base of the fourth transistor is coupled to the anode of the third diode and the first terminal of the second current source is coupled to the collector of the fourth transistor; and a fifth transistor having a base, an emitter, and a collector, wherein the emitter of the fourth transistor and the collector of the second transistor are coupled to the base of the fifth transistor, the emitter of the fifth transistor being coupled to ground.

2. The cubic function generator of claim 1, wherein the collector of the fifth transistor is an output.

3. The cubic function generator of claim 2, wherein the output is a cubic function of the second current source in relation to the first current source.

4. The cubic function generator of claim 1, wherein each transistor is a high speed npn transistor.

5. The cubic function generator of claim 1, wherein the second current source is dependent from the first input current source.

6. The cubic function generator of claim 1, wherein the cubic function generator operates at approximately 2 volts.

7. The cubic function generator of claim 1, wherein the cubic function generator operates at speeds up to and including the gigahertz range.

8. The cubic function generator of claim 1, wherein the cubic function generator is used to tune a power amplifier in a wireless communication system.

* * * * *